United States Patent
Hussain

(10) Patent No.: US 11,019,728 B2
(45) Date of Patent: May 25, 2021

(54) WEARABLE ELECTRONICS FORMED ON INTERMEDIATE LAYER ON TEXTILES

(71) Applicant: KING ABDULLAH UNIVERSITY OF SCIENCE AND TECHNOLOGY, Thuwal (SA)

(72) Inventor: Muhammad Mustafa Hussain, Austin, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 294 days.

(21) Appl. No.: 16/061,542

(22) PCT Filed: Jan. 17, 2017

(86) PCT No.: PCT/IB2017/050242
§ 371 (c)(1),
(2) Date: Jun. 12, 2018

(87) PCT Pub. No.: WO2017/125852
PCT Pub. Date: Jul. 27, 2017

(65) Prior Publication Data
US 2019/0394881 A1     Dec. 26, 2019

Related U.S. Application Data

(60) Provisional application No. 62/280,302, filed on Jan. 19, 2016.

(51) Int. Cl.
*H05K 3/10* (2006.01)
*H05K 3/00* (2006.01)
*D03D 1/00* (2006.01)

(52) U.S. Cl.
CPC ......... *H05K 3/0058* (2013.01); *D03D 1/0088* (2013.01); *H05K 2201/029* (2013.01); *Y10T 29/49155* (2015.01)

(58) Field of Classification Search
USPC ................. 29/846, 825, 829, 848, 850, 854
See application file for complete search history.

(56) References Cited

U.S. PATENT DOCUMENTS 7,845,023 B2 * 12/2010 Swatee .................... C23C 4/04
2/272
2006/0258205 A1    11/2006 Locher et al.
(Continued)

OTHER PUBLICATIONS

Communication pursuant to Article 94(3) EPC in corresponding/related European Application No. 17703224.0, dated Aug. 4, 2020 (Documents D1-D4 were cited in the IDS filed Jun. 12, 2018).
(Continued)

*Primary Examiner* — Thiem D Phan
(74) *Attorney, Agent, or Firm* — Patent Portfolio Builders PLLC

(57) ABSTRACT

One manner of producing more desirable clothing with electronic capabilities is to manufacture electronics, such as the charging wires or devices themselves, directly onto the textile materials. Textile materials generally do not support the manufacturing of electronic devices, in part because the surface of the textile is too rough for electronic devices or the processes used to manufacture electronic devices. An intermediate layer may be placed on the textile material to reduce the roughness of the surface of the textile material and provide other beneficial characteristics for the placement of electronic devices directly on the textile material.

20 Claims, 3 Drawing Sheets

(56) References Cited

U.S. PATENT DOCUMENTS

| | | |
|---|---|---|
| 2009/0053950 A1 | 2/2009 | Surve |
| 2009/0291604 A1 | 11/2009 | Park et al. |
| 2012/0170232 A1* | 7/2012 | Bhattacharya ...... F21V 33/0008 361/749 |
| 2013/0199592 A1 | 8/2013 | Hussain et al. |
| 2014/0141571 A1 | 5/2014 | Hussain et al. |
| 2014/0239459 A1 | 8/2014 | Hussain et al. |
| 2016/0007475 A1 | 1/2016 | Zanesi |

OTHER PUBLICATIONS

International Search Report in related International Application No. PCT/IB2017/050242, dated Mar. 27, 2017.
Written Opinion of the International Searching Authority in related International Application No. PCT/IB2017/050242, dated Mar. 27, 2017.

* cited by examiner

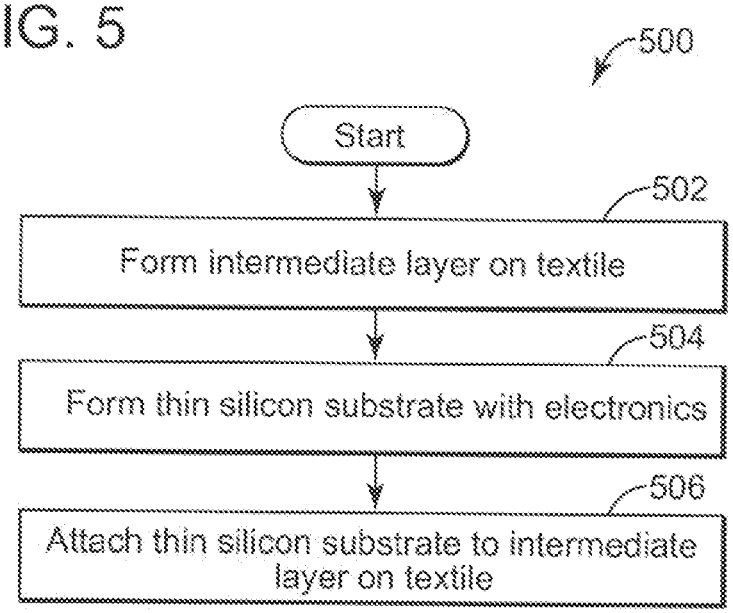

WEARABLE ELECTRONICS FORMED ON INTERMEDIATE LAYER ON TEXTILES

CROSS-REFERENCE TO RELATED PATENT APPLICATIONS

This application is a U.S. National Stage Application of International Application No. PCT/IB2017/050242, filed on Jan. 17, 2017, which claims priority and benefit from U.S. Provisional Patent Application No. 62/280,302, filed Jan. 19, 2016, the entire contents of which are incorporated herein by reference.

FIELD OF THE DISCLOSURE

The instant disclosure relates to electronic. More specifically, portions of this disclosure relate to manufacturing textiles with integrated, wearable electronics.

BACKGROUND

Electronics have ushered in a new era and become integrated with many products. For example, technology originally designed for computers has found its way into phones to create the now ubiquitous smartphone. In another example, that same technology has also found its way into automobiles to create vehicles that can monitor road conditions and lanes, and even in some cases automobiles that can drive themselves. However, one industry that has not been ushered into this new electronics era is textile manufacturing. Clothing and other accessories, generally made from cotton or polyester, have not seen large integration with electronics. Some attempts at integrating electronics include, for example, an outwear jacket with built-in solar panels for charging an electronic device stored in a pocket of the jacket.

FIG. 1A is a drawing illustrating a conventional outerwear jacket with embedded electronics according to the prior art. A jacket 100 may include solar panels 102A, 102B coupled to an electronic device 106 through wires 104A, 104B. The wires 104A, 104B are conventional electrical wiring, similar to that found in device charging cables. That electrical wiring is simply interweaved in the textile material or run between textile material layers such that the wire is hidden from sight. Thus, the outwear jacket 100 of FIG. 1 is not really electronics integrated with the jacket, but a separate component manufactured through a separate process and added to the jacket after the textiles have been separately manufactured.

A close-up view of a textile material, such as one making up the outwear jacket 100 of FIG. 1A, is shown in FIG. 1B. FIG. 1B is a drawing illustrating a surface profile of jacket, or more generally any textile, according to the prior art. The textile of FIG. 1B shows yarn woven together in a cross-hatch pattern. Even with the best textile manufacturing processes, there is still significant variation and roughness across the surface of the textile, or specifically the jacket. Although the magnitude of the roughness is generally irrelevant to humans that wear the jacket, the roughness can be several orders of magnitude larger than the size of electronic components, which can be micrometers or nanometers in size.

Shortcomings mentioned here are only representative and are included simply to highlight that a need exists for improved electrical components, particularly for @@ employed in consumer-level devices, such as mobile phones. Embodiments described herein address certain shortcomings but not necessarily each and every one described here or known in the art.

SUMMARY

The type of integration of electronics with clothing shown in FIG. 1A offers limited capabilities. For example, the placement of charging wires in less bulky clothing is uncomfortable for the person wearing the clothing and an unfashionable sight. With outerwear jackets, the wire can be concealed in thick layers of fabric. However, in summer wear, the charging wire may be thicker than the fabric. Further, the number of wires increases as more electronic devices are connected together through the clothing, thus making the wearer more uncomfortable.

One manner of producing more desirable clothing with electronic capabilities is to manufacture electronics, such as the charging wires or devices themselves, directly onto the textile materials. Textile materials generally do not support the manufacturing of electronic devices, in part because the surface of the textile is too rough for electronic devices or the processes used to manufacturing electronic devices. For example, the roughness of the surface of a textile material such as cotton can have a variation of hundreds of micrometers or even millimeters. In contrast, electronic components, such as transistors or interconnects can be only tens or hundreds of nanometers in width and thickness. Thus, the variation across a textile surface can be many orders of magnitude larger than the electronic components themselves.

An intermediate layer may be placed on the textile material to reduce the roughness of the surface of the textile material and provide other beneficial characteristics for the placement of electronic devices directly on the textile material. The intermediate layer may be an insulating layer to separate the electronics from the textile material and provide a smooth surface for the electronics as well as accommodate the manufacturing processes for the electronics. The intermediate layer may also be a semiconducting layer that separates the electronics from the textile material and also serves as a component in the electronics, such as by being a conduction channel in a transistor.

According to one embodiment, a method may include forming an intermediate layer on a textile material and forming electronics on the intermediate layer on the textile material.

According to another embodiment, an apparatus includes a textile material, an intermediate layer on the textile material, and electronics on the intermediate layer.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 5 is a flow chart illustrating a method of manufacturing wearable electronics on textile materials by attaching silicon substrates according to one embodiment of the disclosure.

DETAILED DESCRIPTION

Figure 1A:
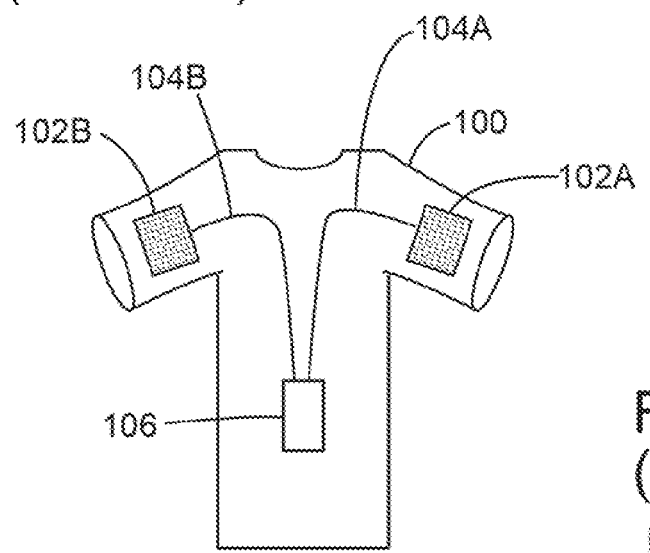
FIG. 1A is a drawing illustrating a conventional outerwear jacket with embedded electronics according to the prior art.
Figure 1B:
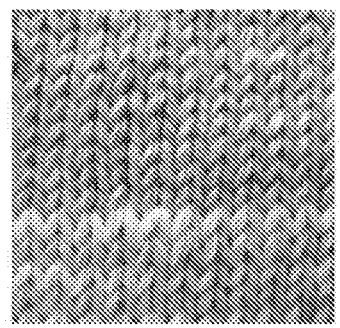
FIG. 1B is a drawing illustrating a surface profile of textile according to the prior art.
Figure 2:
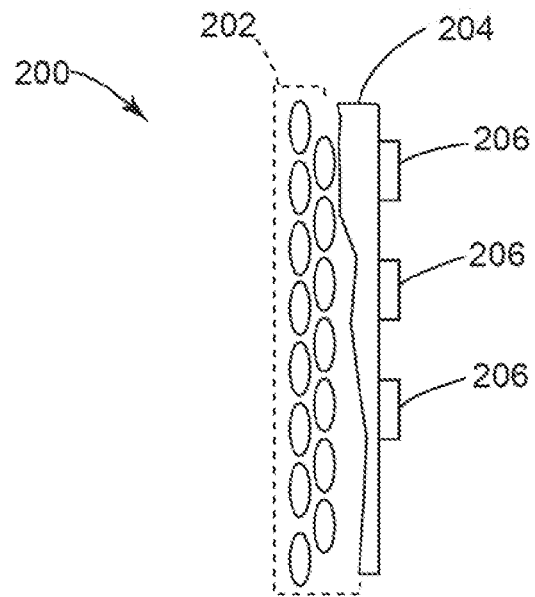
FIG. 2 is a cross-section illustrating wearable electronics attached to textile materials through an intermediate layer according to one embodiment of the disclosure.

FIG. 2 is a cross-section illustrating wearable electronics attached to textile materials through an intermediate layer according to one embodiment of the disclosure. In an article 200 of clothing, an intermediate layer 204 may be formed on textile material 202. Electronics 206 may then be formed on the intermediate layer 204. The intermediate layer 204 may be placed on the textile material 202 to reduce the roughness of the surface of the textile material 202 and provide other beneficial characteristics for the placement of electronics 206 directly on the textile material 202. The intermediate layer 204 and the electronics 206 may be formed by many manufacturing methods and techniques, some of which are described with reference to FIG. 3, FIG. 4, and FIG. 5. The textile material 202 may be, for example, cotton, polyester, silk, wool, or jeans. The intermediate layer 204 may be either a semiconducting layer or an insulating layer. When the intermediate layer 204 is an insulating layer, electronics may be built on top of the insulating layer. When the intermediate layer 204 is a semiconducting layer, the semiconducting layer may be part of the electronics, such as by being a conduction channel for a transistor. The electronics 206 may include components that make up a larger electronic device, such as transistors that are used to build logic circuitry. The electronics 206 may also include interconnects for transporting power and signals between devices coupled together through the article 200.

Figure 3:
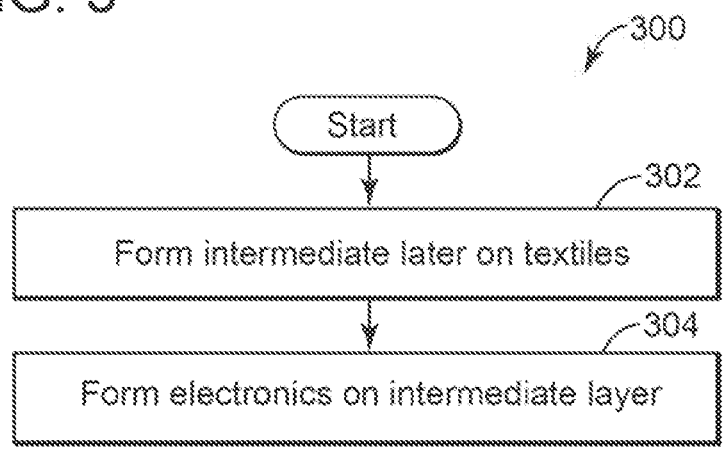
FIG. 3 is a flow chart illustrating a method of manufacturing wearable electronics on textile materials with an intermediate layer according to one embodiment of the disclosure.

FIG. 3 is a flow chart illustrating a method of manufacturing wearable electronics on textile materials with an intermediate layer according to one embodiment of the disclosure. A method 300 begins at block 302 with forming an intermediate layer on a textile. Then, at block 304, electronics are formed on the intermediate layer on the textile. The electronics may be formed, for example, through formation of suspensions, ink jet printing, additive manufacturing, and/or vacuum technologies such as physical sputter deposition, evaporation, and chemical vapor deposition.

Figure 4:
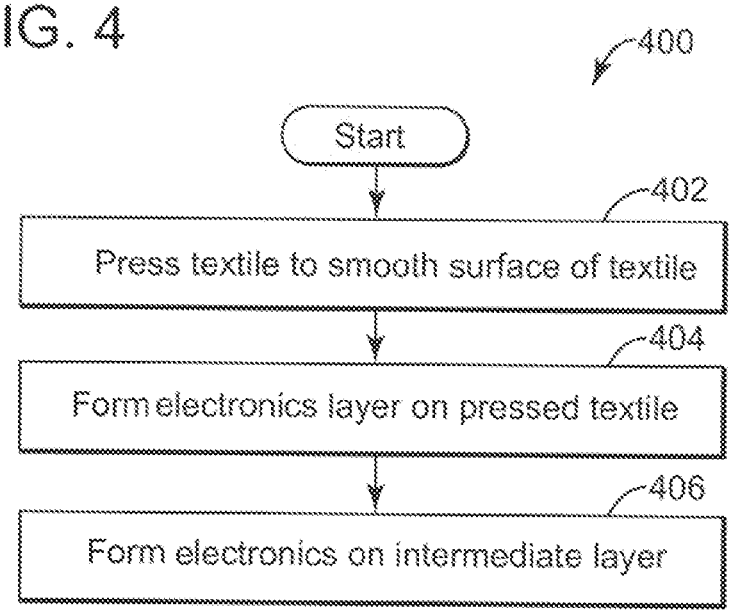
FIG. 4 is a flow chart illustrating a method of manufacturing wearable electronics on textile materials by pressing textiles and forming an intermediate layer on the pressed textile according to one embodiment of the disclosure.

FIG. 4 is a flow chart illustrating a method of manufacturing wearable electronics on textile materials by pressing textiles and forming an intermediate layer on the pressed textile according to one embodiment of the disclosure. A method 400 begins at block 402 with pressing a textile to smooth a surface of the textile, such as by iron pressing the textile. Then, at block 404, an intermediate layer is formed on the pressed textile of block 402. The intermediate layer may be formed by, for example, paint brushing or any of the techniques described above with reference to FIG. 3. Next, at block 406, electronics are formed on the intermediate layer. The electronics may be formed, for example, through formation of suspensions, ink jet printing, additive manufacturing, and/or vacuum technologies such as physical sputter deposition, evaporation, and chemical vapor deposition.

FIG. 5 is a flow chart illustrating a method of manufacturing wearable electronics on textile materials by attaching silicon substrates according to one embodiment of the disclosure. A method 500 begins at block 502 with forming an intermediate layer on a textile. Then, at block 504, thin silicon substrates are formed through a different process, and those thin silicon substrates may include electronics manufactured thereon. Some methods for producing the thin silicon substrates are disclosed in U.S. Patent Application Publication Nos. 2014/0239459 entitled "Method for producing mechanically flexible silicon substrate," and 2014/0141571 entitled "Integrated circuit manufacturing for low-profile and flexible devices," which are incorporated by reference herein. Next, at block 506, the thin silicon substrates are attached to the intermediate layer on the textile, such as through the use of adhesives, including polymers and resins.

The electronics integrated into textile clothing may be formed into any type of electronic device or component for an electronic device. For example, the electronics 206 of FIG. 2 may form light emitting diodes (LEDs) for emitting light of different colors. Thus, wearable clothing may be manufactured allowing changes to styling of the clothing. The LEDs may be programmed to display different colors, display stripes, display herring bones, or display another custom style. In another example, the electronics 206 of FIG. 2 may be designed to add utility to the clothing, such as by providing water repelling capability, self-cleaning capability, or bug-repelling capability. In a further example, the electronics of FIG. 2 may be designed to control climate around the wearer, such as by cooling or heating the wearer. In yet another example, the electronics 206 of FIG. 2 may be designed to produce energy, such as by converting light or heat to energy, and supply charge to other electronics either integrated with the clothing or external to the clothing. In one embodiment, the electronics 206 may include a thermoelectric generator (TEG) configured to convert heat into energy for charging mobile electronic devices, such as a smartphone or tablet. Some thermoelectric generator designs and manufacturing methods are described in U.S. Patent Application Publication No. 2013/0199592 entitled "Apparatuses and systems for embedded thermoelectric generators," which is hereby incorporated by reference herein. In other examples, the electronics 206 of FIG. 2 may include sensors, logic circuitry, and/or processors.

The schematic flow chart diagrams of FIG. 3, FIG. 4, and FIG. 5 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   forming an intermediate layer on plural fibers of yarn woven together in a pattern forming a textile material; and
   forming electronics on the intermediate layer on the yarn woven together in the pattern forming the textile material,
   wherein the step of forming the electronics comprises attaching an already formed thin silicon substrate with the electronics to the intermediate layer on the yarn woven together in the pattern forming the textile material.

2. The method of claim 1, wherein the intermediate layer is formed with a surface having a lower roughness than the yarn woven together in the pattern forming the textile material.

3. The method of claim 1, wherein the step of forming the intermediate layer comprises depositing the intermediate layer on the yarn woven together in the pattern forming the textile material by at least one of ink jet printing, vacuum deposition, additive manufacturing, and suspensions.

4. The method of claim 1, further comprising pressing the yarn woven together in the pattern forming the textile material before forming the intermediate layer on the yarn woven together in the pattern forming the textile material.

5. The method of claim 4, wherein the step of forming the intermediate layer comprises forming the intermediate layer on the yarn woven together in the pattern forming the textile material by a paint brushing technique.

6. The method of claim 1, wherein forming the intermediate layer comprises at least one of forming an insulating layer and forming a semiconductor layer.

7. The method of claim 1, wherein forming the electronics comprises forming at least one of a light emitting diode (LED), a thermoelectric generator (TEG), a sensor, an interconnect, and a processor.

8. The method of claim 1, wherein the thin silicon substrate is formed through a process different from the process of forming the intermediate layer on the yarn woven together in the pattern forming the textile material.

9. The method of claim 1, wherein the attaching of the thin silicon substrate to the intermediate layer comprises attaching the thin silicon substrate to the intermediate layer by an adhesive.

10. The method of claim 9, wherein the adhesive comprises one or more of polymers and resins.

11. The method of claim 1, wherein the yarn woven together in the pattern forming the textile material comprises at least one of cotton, polyester, silk, wool, and jeans.

12. An apparatus, comprising:
    yarn woven together in a pattern forming a textile material;
    an intermediate layer extending over plural fibers of the yarn woven together in the pattern forming the textile material; and
    electronics on the intermediate layer,
    wherein the electronics on the intermediate layer include a thin silicon substrate attached on the intermediate layer and extending over the plural fibers.

13. The apparatus of claim 12, wherein the yarn woven together in the pattern forming the textile material comprises at least one of cotton, polyester, silk, wool, and jeans.

14. The apparatus of claim 12, wherein the electronics comprise at least one of a light emitting diode (LED), a thermoelectric generator (TEG), a sensor, an interconnect, and a processor.

15. The apparatus of claim 12, wherein the intermediate layer is configured with a surface having a lower roughness than the yarn woven together in the pattern forming the textile material.

16. The apparatus of claim 12, wherein the yarn woven together in the pattern forming the textile material comprises a pressed textile material.

17. The apparatus of claim 16, wherein the yarn woven together in the pattern forming the textile material is pressed before the intermediate layer is deposited on the yarn woven together in the pattern forming the textile material.

18. The apparatus of claim 17, wherein the intermediate layer is deposited on the yarn woven together in the pattern forming the textile material by a paint brushing technique.

19. The apparatus of claim 12, wherein the thin silicon substrate is attached to the intermediate layer by an adhesive.

20. The apparatus of claim 12, wherein the intermediate layer comprises at least one of a semiconductor material and an insulating material.

* * * * *